United States Patent [19]

Murphy et al.

[11] Patent Number: 4,525,688
[45] Date of Patent: Jun. 25, 1985

[54] OSCILLOSCOPE SIGNAL INPUT CIRCUIT INCLUDING AN ATTENUATOR

[75] Inventors: Desmond L. Murphy, Portland; Warren K. Wimmer, Tigard, both of Oreg.

[73] Assignee: Tektronix, Inc., Beaverton, Oreg.

[21] Appl. No.: 518,904

[22] Filed: Aug. 1, 1983

[30] Foreign Application Priority Data

Aug. 2, 1982 [JP] Japan .............................. 57-133846

[51] Int. Cl.³ .............................................. H01P 1/22
[52] U.S. Cl. .................................... 333/81 R; 330/51; 330/125
[58] Field of Search ................. 330/51, 107, 125, 311; 333/81 R, 172

[56] References Cited

U.S. PATENT DOCUMENTS 3,586,989 6/1971 Wheable .............................. 330/51

Primary Examiner—James B. Mullins
Assistant Examiner—Steven J. Mottola
Attorney, Agent, or Firm—George T. Noe

[57] ABSTRACT

An improved signal input circuit suitable for use in wideband oscilloscopes includes a high impedance controllable attenuator stage.

2 Claims, 6 Drawing Figures

OSCILLOSCOPE SIGNAL INPUT CIRCUIT INCLUDING AN ATTENUATOR

BACKGROUND OF THE INVENTION

This invention relates generally to a signal input circuit, more specifically to an input circuit of an electronic measurement instrument such as an oscillosope or the like.

An input circuit of high precision quantitative measurement instrument like an oscilloscope is required to have a high impedance controllable attenuator stage for conditioning the wideband input signal without causing loading effect on the signal source to be measured.

For better understanding of the invention, a prior art oscilloscope is briefly described by reference to FIG. 1 which shows a simplified block diagram of a conventional oscilloscope. An input signal which varies in amplitude and frequency is applied to vertical input terminal 10 through a coaxial cable or an electrical probe. Coupled to input terminal 10 is input conditioning circuit 12 which may include a coupling circuit for selecting AC, DC or GND (ground), and a switchable attenuator. The output from signal conditioning circuit 12 is amplified by preamplifier 14, paraphase amplifier 16 for converting the single ended input signal into the push-pull or balanced output signal, and output amplifier 18 before being applied to the vertical deflection plates of cathode ray tube (CRT) 20. A fixed delay line (not shown) may be interposed between amplifiers 16, 18. Trigger generator 26 generates a sweep gate signal in synchronism with a trigger signal which may be the vertical input signal itself picked off from amplifier 16 in the internal (INT) trigger mode or an external trigger signal applied to external trigger input terminal 22 in the external (EXT) triggr mode. Either INT or EXT trigger mode is chosen by trigger mode switch 24. The sweep gate signal is applied to sweep generator 28 which generates a ramp signal for driving the horizontal deflection plates of CRT 20 after being amplified by horizontal amplifier 30. Although not shown in FIG. 1, an unblanking circuit is also employed for blanking or unblanking control of the electron beam.

In operation, the vertical input is first conditioned to appropriate amplitude by selecting attenuator in signal conditioning circuit 12 and then amplified to a certain large amplitude, e.g., 30 volts or so to provide the required vertical deflection of the electron beam. DC coupling is used to observe the wideband input signal up to its upper cut-off frequency, e.g. 100 MHz. In other words, both DC and AC signal components are observed in this mode. AC coupling is used to observe only AC components of the input signal, thereby eliminating DC and low frequency components below its lower cut-off frequency. GND is used to connect the input of the oscilloscope to ground while disconnecting the signal from the input signal source, thereby confirming the DC reference level on the CRT screen. The electron beam of the CRT is swept across the screen at a constant rate determined by the timing elements of ramp generator 28. The ramp signal is synchronized with the input signal to provide a stationary waveform of the input signal.

Impedance converter 14 is used to provide a high input impedance, e.g. 1MΩ for the minimum loading effect on the input signal source and also a low output impedance for ease of wideband signal amplification. For this end, impedance converter 14 may include a source follower input stage and an emitter follower output stage. Paraphase amplifier 16 is used to provide the balanced output suited for driving CRT deflection plates and also for picking off one part of the signal for triggering purpose.

One example of multi-stage attenuators for high frequency application is disclosed in U.S. Pat. No. 3,753,170, assigned to the assignee of the present invention. Each attenuator stage of the conventional attenuator is shown in FIG. 2. A pair of specially designed switches $S_1$, $S_2$ are connected in series between input terminal $T_1$ and output terminal $T_2$. Switches $S_1$, $S_2$ are disclosed in detail in U.S. Pat. No. 3,719,788, also assigned to the assignee of the present invention. Short bar SB is connected between upper terminals of switches $S_1$ and $S_2$ while the lower terminals thereof are connected via high impedance RC attenuator comprising resistors $R_1$, $R_2$ and and capacitors $C_1$, $C_2$, $C_3$. Another variable capacitor $C_4$ is coupled to output terminal $T_2$ in shunt relation to the signal path. Also, connected to output terminal $T_2$ is a parallel combination of resistor $R_0$ and capacitor $C_0$ representing respectively the input resistance and capacitance of impedance converter 14.

Switches $S_1$ and $S_2$ may be compared to single pole double-throw switches. In their upper position, input and output terminals $T_1$-$T_2$ are directly coupled, thereby by-passing the attenuator. Capacitor $C_4$ is used to adjusted the total input capacitance to a predetermined value ($C_{in}$), thereby compensating for input impedance of impedance converter 14 which largely depends on the gate-to-drain capacitance of source follower transistor among some other stray capacitance. In the lower position of switches $S_1$ and $S_2$, the input signal is attenuated by the RC attenuator now interposed between input and output terminals $T_1$-$T_2$. The attenuation ratio may be any desired value. In a case of attenuation factor of 5, $R_1$ and $R_2$ are chosen to 800 kΩ and 250 KΩ, respectively. The input resistance remains unchanged (1MΩ) in this switch position. Shunt capacitor $C_1$ is used to realize a wideband attenuator. The relation of $R_1 C_1 = R_2//R_0(C_0+C_4+C_2)$ must be maintained for the wideband attenuator. $R_2//R_0$ is the parallel resistance of resistors $R_2$ and $R_0$. Variable resistor $C_2$ is used for this purpose. Another variable capacitor $C_3$ is used to equalize the input capacitance of the attenuator $C_{in}$, thereby maintaining the frequency response of the attenuator circuit constant regardless of different attenuation factors.

FIG. 3 shows examples of conventional impedance converter 14 and paraphase amplifier 16 in FIG. 1. Impedance converter 14 consists of source follower input stage including field effect transistors (FETs) 36, 38 and resistor 40, and emitter follower output stage including bipolar transistor 42. The gate of FET 36 is coupled to input terminal 32 and returned to ground through resistor 34 which determines the input resistance. FET 38 and resistor 40 constitutes a current source. Paraphase amplifier 16 comprises two pairs of emitter coupled transistors 44-46 and 48-50. The emitter output of emitter follower transistor 42 is then supplied to the base of transistor 44 while a vertical position control signal from potentiometer 52 is supplied to the base of transistor 46. The bases of transistors 48 and 50 are connected to the emitters of transistors 44 and 46, respectively. The collectors of transistors 44-46 are coupled via terminals 54-56 to the input of vertical output amplifier 18, while the collector of transistor 50 provides a trigger signal from terminal 58.

As is understood from the foregoing description, conventional signal input circuit has a few disadvantages. Firstly, at least two specially designed switches are required for each attenuator stage, thereby making the switches and driving mechanism bulky, complicated, less reliable and also expensive because of the use of gold plated contacts. This is not negligible especially when using several cascaded attenuator stages as shown in the aforementioned prior art. Secondly, the vertical amplifier section is relatively complex to provide the required impedance conversion and to extract one part of the signal for triggering purposes. Thirdly, the frequency response is not flat over wide frequencies. In other words, fractions of the input signal components are lost due to capactive elements especially at high frequencies.

It is therefore the object of this invention to provide an improved signal input circuit free from the aforementioned disadvantages, and especially suited for a wideband test and measurement instrument like an oscilloscope.

DETAILED DESCRIPTION OF THE INVENTION

Figure 1:
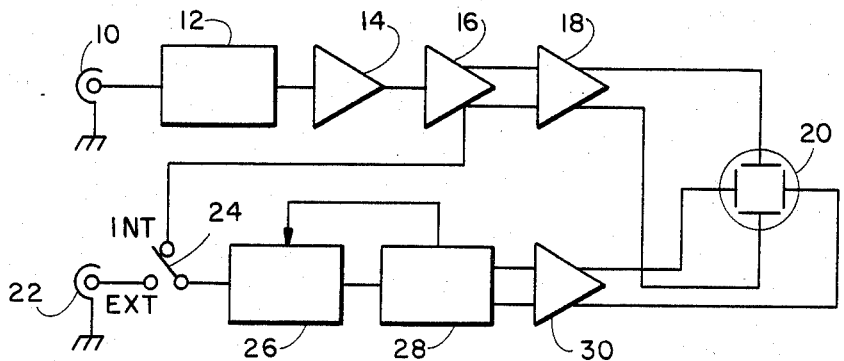
FIG. 1 is a simplified block diagram of an oscilloscope.
Figure 2:
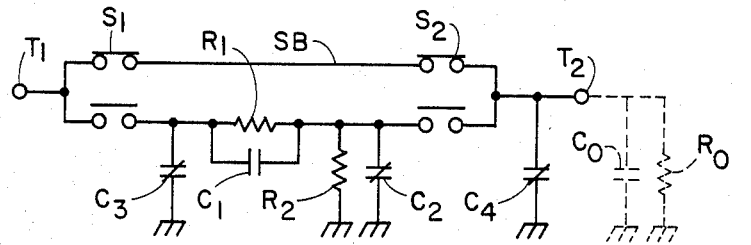
FIG. 2 is a conventional attenuator stage.
Figure 3:
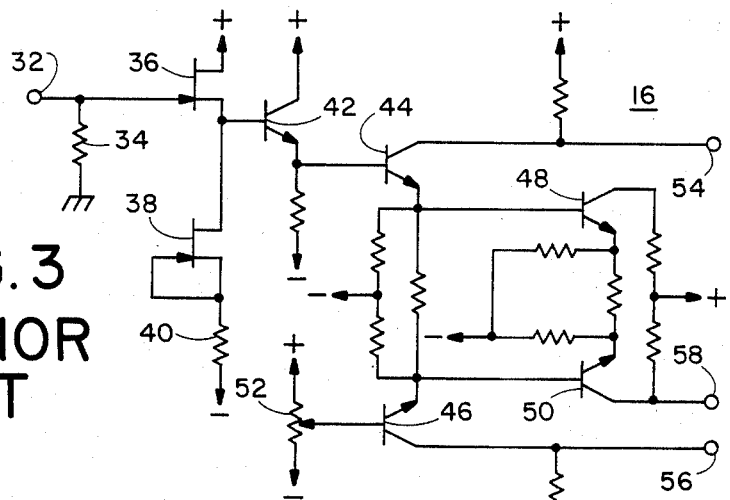
FIG. 3 is a conventional impedance converter.
Figure 4:
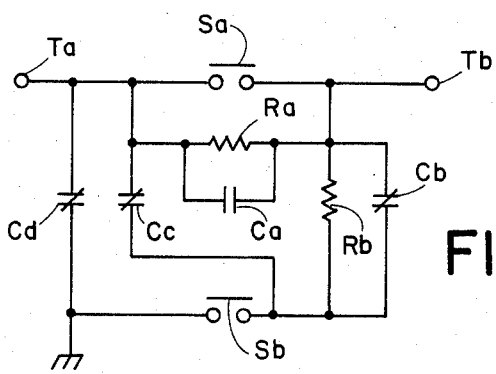
FIG. 4 is a basic circuit of the attenuator to be used in the present invention.

The present invention will be described hereinafter by reference to FIGS. 4 through 6. FIG. 4 is a simplified circuit schematic of the attenuator stage. $T_a$ and $T_b$ are input and output terminals which may be coupled together either through switch $S_a$ or RC divider network comprising resistors $R_a$, $R_b$ and capacitors $C_a$, $C_b$, $C_c$. The common terminals of resistor $R_b$ and capacitors $C_b$, $C_c$ are returned to ground through another switch $S_b$ which is ganged with switch $S_a$. Variable capacitor $C_d$ is also connected in shunt relation to input terminal $T_a$. The entire attenuator assembly is formed on a substrate by hybrid technology. Switches $S_a$, $S_b$ are preferably identical to either one of switches $S_1$, $S_2$ in FIG. 2 and disclosed in the specification of the aforementioned U.S. Pat. No. 3,719,788. However, they may be any conventional switches including electrical relays.

For selecting zero attenuation position, switches $S_a$ and $S_b$ are on and off, respectively. Variable capacitor $C_d$ adjusts the total input capacitance to a predetermined value. It should be noted that capacitors $C_a$, $C_b$, $C_c$ have essentially no effect in this position. In the attenuated position switches $S_a$ and $S_b$ are respectively off and on, thereby interposing the RC attenuator of a predetermined attenuation factor, e.g., 5. Variable capacitor $C_b$ is first adjusted so that the attenuator provides the given attenuation over the entire frequency range. Variable capacitor $C_c$ is then adjusted to equalize the total input capacitance $C_{in}$. The significant advantage of this attenuator is to cut the required switches to one half of that required for attenuators of the prior art, thereby increasing reliability and decreasing production cost and required space.

Figures 5, 6:
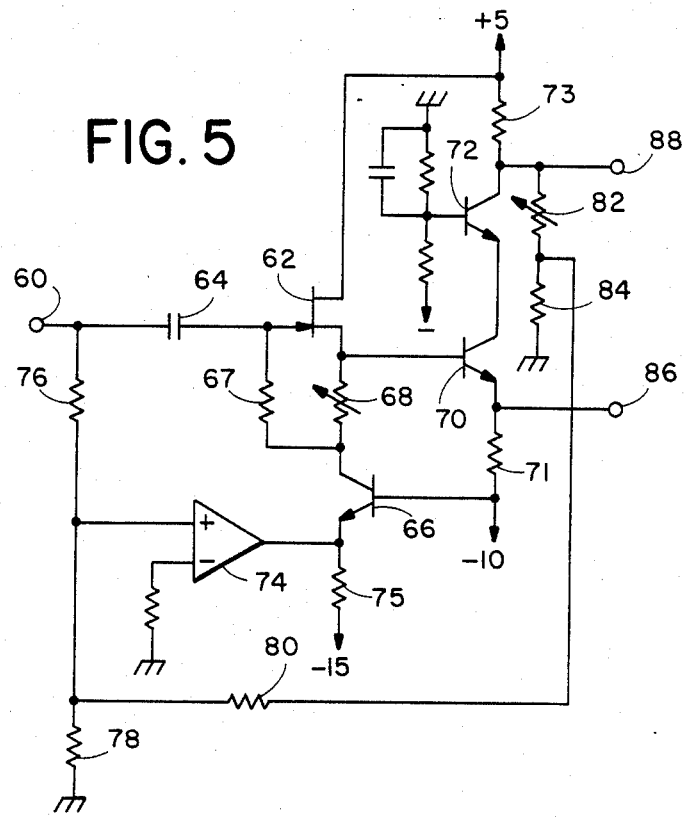
FIG. 5 is a preferred embodiment of the impedance converter for this invention.
FIG. 6 is a practical signal input circuit according to one embodiment of this invention.

FIG. 5 shows one preferred embodiment of the impedance converter. An input signal to the impedance converter is applied via input terminal 60 and coupling capacitor 64 of fairly low capacitance (e.g. 50 PF or less) to the gate FET 62 operating as a source follower input stage amplifier together with current source bipolar transistor 66. The source voltage of FET 62 is then applied to the base input of cascade connected emitter follower output stage amplifier including NPN transistors 70 and 72. Proper base bias voltage is applied to transistor 72. A vertical output signal and a trigger signal are derived respectively from first output terminal 86, or the emitter of transistor 70 and second output terminal 88, or the collector of transistor 72. Differential operational amplifier 74 is also employed to drive the emitter of transistor 66. The inverting input of operational amplifier 74 is referenced to ground through a resistor, while the non-inverting input is coupled to the junction of resistors 76–78 connected in series between input terminal 60 and ground. The collector output of transistor 72 is divided by variable attenuator including resistors 82–84 before being supplied through resistor 80 to the non-inverting input terminal of amplifier 74. Variable resistor 68 and resistor 67 of very high resistance (e.g. 10MΩ) are used for proper biasing of FET 62.

In operation, FET 62 operates as a source follower amplifier only for high frequency signal components transmitted through small coupling capacitor 54. However, low frequency components including DC are amplified by operational amplifier 74. Therefore, both low and high frequency components are combined at the source of FET 62 and transmitted to both output terminals 86 and 88 of the cascade output stage amplifier in opposite phase polarity. The non-inverting input terminal of differential amplifier 74 is virtual ground and resistor 76 sets the input resistance of the impedance converter to a predetermined value, e.g. 1MΩ. When low frequency components of the input signal applied to input terminal 60 tend to increase, a fraction of the signal divided by resistive divider primarily resistors 76–78 may pull up the non-inverting input of amplifier 74, thereby pulling up the base voltage of emitter follower transistor 70. The increased collector currents of transistors 70 and 72 pull down the output voltage on output terminal 88. A fractional negative going output from the variable divider 82–84 is then fed back to the non-inverting input terminal of amplifier 74 via resistor 80. High gain characteristic of operational amplifier 74 allows the amplifier to operate in such a manner that the increased (or decreased) input signal on its non-inverting input terminal by the input signal applied to input terminal 60 is effectively canceled by the decreased (or increased) output from output terminal 88. The low frequency gain can effectively be controlled by variable resistor 82. By proper adjustment of variable resistor 82, the overall frequency response or the bandwidth of the impedance converter may be improved to some extent. In other words, the high frequency response may be enhanced with respect to the low frequency response.

FIG. 6 is a circuit schematic of one practical signal input circuit for an oscilloscope employing this invention. This is essentially a combination of attenuator stage of FIG. 4 and impedance converter of FIG. 5 except input coupling selection circuit 90 and output attenuator section 92. Input coupling section 90 is connected between input terminal 10 and an input first attenuator section. Ganged switches $S_c$–$S_c'$ are used to ground the input of the input stage attenuator through switch $S_c'$ but disconnecting input terminal 10. In other modes (i.e., 1MΩ and 50Ω modes), series switch $S_c$ is on and shunt switch $S_c'$ is off. Another switch $S_d$ is used to select either 1MΩ mode (off) or 50Ω mode (on). Input terminal 10 is shunted through series resistors 96–97 having 50Ω resistance in total. A protection circuit comprising resistors 89, 99, 100, 101 and terminals 102, 103 is used for over voltage protection. A predetermined low voltage e.g. 5 volts is applied to terminal 102 and a node voltage of the resistive divider is detected on terminal 103 to protect the circuit by automatically turning off switch $S_d$ when an excessive voltage is applied. Resistor 96 is used to heat sensitive resistor 98 and thermistor 101 is used to cancel the effect of ambient temperature.

The input signal on input terminal 10 is then applied through small resistor $r_0$ to the input of the input attenuator which is essentially the same as the attenuator shown in FIG. 4 except the inclusion of small resistors $r_a$ and $r_b$ for better electrical performance. The output from the input attenuator is then applied via impedance converter 16' to output stage attenuator 92 including ganged switches $S_e$–$S_e'$ and $S_j$–$S_j'$ as well as the respective series and shunt resistors. Output attenuator 92 is used to attenuate the input signal, for example, by the factor of 2, 2.5 and 5.

Although only one attenuator stage is used as the input attenuator, more than one attenuator stage may be connected in cascade depending on applications to accomodate wide range of input signals.

As described hereinbefore, the signal input circuit according to this invention is simple in circuit construction and therefore increases the reliability in addition to cost and assembly time reduction. The use of the particular impedance converter is useful to provide wider frequency bandwidth with minimum drift and two output signals. As a result, the signal input circuit according to this invention is particularly useful for the vertical input stage of an oscilloscope. It is, however, noted that various modifications and applications may be made by a person skilled in the art without departing from the subject matter of this invention.

I claim:

1. A signal input circuit, comprising:
   a first switch connected between an input and an output terminal;
   an attenuator network comprising a first parallel resistor-capacitor combination connected between said input and output terminals, and a second parallel resistor-capacitor combination connected between said output terminal and a common terminal; and
   a second switch connected between said common terminal and ground,
   wherein said first and second switches are operated in opposite state to each other.

2. A signal input circuit in accordance with claim 1, further including an impedance converter comprising parallel AC and DC signal paths coupled to said output terminal.

* * * * *